United States Patent [19]
Adams et al.

[11] Patent Number: 6,061,010
[45] Date of Patent: May 9, 2000

[54] DUAL RETURN-TO-ZERO PULSE ENCODING IN A DAC OUTPUT STAGE

[75] Inventors: Robert W. Adams, Acton; Khiem Quang Nguyen, Tewksbury, both of Mass.

[73] Assignee: Analog Devices, Inc., Norwood, Mass.

[21] Appl. No.: 08/936,754

[22] Filed: Sep. 25, 1997

[51] Int. Cl.[7] .................................................. H03M 1/66
[52] U.S. Cl. ......................................... 341/144; 341/152
[58] Field of Search .................................... 341/143, 144, 341/152

[56] References Cited

U.S. PATENT DOCUMENTS

| | | | |
|---|---|---|---|
| 4,772,871 | 9/1988 | Suzuki et al. ........................... | 341/155 |
| 4,947,171 | 8/1990 | Pfeifer et al. ........................... | 341/143 |
| 5,528,239 | 6/1996 | Swanson et al. ....................... | 341/143 |
| 5,610,606 | 3/1997 | Fukunaga et al. ...................... | 341/143 |
| 5,719,572 | 2/1998 | Gong ....................................... | 341/131 |

*Primary Examiner*—Marc S. Hoff
*Attorney, Agent, or Firm*—Wolf, Greenfield & Sacks, P.C.

[57] ABSTRACT

In an output stage for a DAC, such as an oversampled DAC, an apparatus and method which generates, for each bit clock period and for each bit to be converted, two or more (not just one) return-to-zero (RTZ) signals. The RTZ signals are delayed from the other (if two RTZ signals are employed, they are delayed by one-half clock cycle relative to each other). The two RTZ signals are summed to yield the DAC output from said bit.

6 Claims, 4 Drawing Sheets

DUAL RETURN-TO-ZERO PULSE ENCODING IN A DAC OUTPUT STAGE

FIELD OF THE INVENTION

This invention relates principally to the field of digital to analog conversion and, most particularly, to converters employing oversampling techniques. The invention is not limited to such uses, however, and is a pulse encoding technique and apparatus which may be employed in other settings, as well, particularly those where signaling with low inter-symbol interference is needed.

BACKGROUND

In recent times, there has been an increasing need for digital-to-analog converters (DACs) which exhibit extremely high accuracy in converting a digital number to an analog signal, particularly high-speed converters. Accuracy may be expressed in terms of a signal-to-noise ratio (SNR), inaccuracy being equivalent to the introduction of a noise component. DACs with SNRs of more than 100 dB are sought for modem applications. Achieving such accuracy is difficult and costly.

One of the most important influences on DAC output accuracy is the accuracy of the analog weights employed in the converter (i.e., the scaled voltages or currents which combine to form the converter's output). The accuracy of the weights is most often considered from a viewpoint of static performance. Additionally, in high-speed converters, such as those used in sigma-delta DAC output stages, or for video-speed converters, dynamic effects are often just as important as static accuracy. These dynamic effects are characterized by, or attributable to, the way in which the DAC makes a transition from one digital code to the next. A DAC with poor dynamic performance will produce high distortion, as shown on a spectrum analyzer, even though the analog weights may be very accurate.

While a number of factors affect the dynamic performance of a DAC, inter-symbol interference (ISI) is one of the most important. In this context, ISI occurs when the DAC output waveform for a particular clock period is a function not only of the digital code applied to the DAC for that clock period, but also of the digital code applied for a preceding clock period. This interference can cause both distortion and noise to appear at the DAC output.

In a DAC, ISI manifests itself by the area under the DAC output waveform for a given clock period (i.e., the time integral of the output) depending partly on the applied digital code (i.e., input signal value) during the previous clock period. In such a DAC, the accuracy of the area under the output waveform curve for a selected output sample is an extremely important measure of performance, as it contributes heavily to the purity of the low-frequency part of the output spectrum. That is, the output of an n-bit DAC comprises the sum of "n" analog waveforms, taking the form of a voltage or a current. In order for the DAC output to be free of ISI, each individual constituent analog bit waveform thus must be free of ISI (the output being a linear summation of the constituent waveforms).

The problem is illustrated with reference to FIGS. 1 and 2. In FIG. 1 there is shown a block diagram of a typical output stage 10 for a DAC whose output is an analog current (actually a differential current pair Iout+ and Iout−). The output signal is generated by a set of weighted current sources $12_0 \ldots 12_N$, where N is the number of bits in the DAC's digital input code, there being one switch per bit. The currents from the current sources are selectively switched into the output to contribute to the output signal via a corresponding set of switches $14_0 \ldots 14_N$. The settings of the switches are determined by control logic 16 each time a clock signal is received, in accordance with a digital input code supplied thereto. The switches are typically switched on an edge of the clock signal.

One significant mechanism which gives rise to ISI may be understood by considering the output contribution of the source $12_0$, which is driven by the most significant bit (MSB), bit 0. ISI may result from unequal rise and fall times in the MSB output current contribution from source $12_0$. As shown in part A of FIG. 2, the rising clock edges are active clock edges (i.e., edges to which the switches respond) and occur at times T1, T2, etc. The time interval between two consecutive active clock edges is called a bit clock period and is the time during which a particular signal sample is valid. (It is equal in length to a cycle of the clock signal.) The data may take a finite time, of course, to reach a settled value, due to rise time and fall time limitations.

Assume that for the three clock intervals T1-T2, T2-T3 and T3-T4, the MSB pattern is 110. Assuming the previous bit was a 0, the waveform $I_0$ at the output of switch $14_0$ thus rises, starting at time T1, for a rise time $T_{rise}$, until it reaches a value $I_{ref}$. It holds this value, which represents a digital one, until time T3. At time T3, the bit value goes to zero but the analog current $I_0$ cannot change instantaneously so it falls over an interval $T_{fall}$ until it is back to zero. Now consider the situation when for the three clock intervals T1-T2, T2-T3 and T3-T4, the MSB pattern is 101. The resulting waveform for $I_0$ is shown in part B of FIG. 2. The area under waveform $I_0$ of part A is given by $(T4-T1)*I_{ref}-.5*T_{rise}*I_{ref}+.5T_{fall}*I_{ref}$; in contrast, the area under waveform $I_0$ of part B is given by $(T4-T1)*I_{ref}-T_{rise}*I_{ref}+T_{fall}*I_{ref}$. Only if $T_{rise}$ and $T_{fall}$ are equal will the areas under the waveforms of parts A and B of FIG. 2 be equal. When $T_{rise}$ and $T_{fall}$ are unequal, the low-frequency spectra of the two waveforms will be different. The DAC output is quite sensitive to this error. Indeed, for a typical oversampled audio converter (e.g., a sigma delta converter), high performance may require that $T_{rise}$ and $T_{fall}$ be matched to less than ten picoseconds.

Conventionally, this kind of ISI is reduced by forcing the output bit to start from zero, reach its final value, and return to zero all within a single bit clock period (clock cycle). This is called a "return-to zero" (RTZ) code. Since there is a rise and a fall within every clock cycle, the area under each waveform pulse is guaranteed to be independent from prior bit values.

Unfortunately, the RTZ approach is not without its limitations. FIG. 3 shows a conventional DAC output 22, with the rise and fall times exaggerated to show a mismatch between them. The corresponding output waveform when an RTZ scheme is employed is shown at 24 in FIG. 4. The reader will observe that the RTZ scheme introduces full-scale steps into the output waveform. This potentially degrades performance or causes problems in two ways. First, the operation of a circuit connected to receive the DAC output may become non-linear when driven by such large, high-speed steps. Second, any error in the clock edge timing, due to jitter or other mechanisms, may produce a large error in the output due to the large step size. In oversampled DACs, this is a particularly egregious problem because sample-to-sample output current or voltage differences normally would be a small fraction of the full-scale range of the converter; however, using an RTZ scheme, the average step size may be dramatically larger and the sensitivity to clock jitter may therefore be degraded seriously. Additionally, increased filtering is needed in order to obtain a smooth output waveform for subsequent utilization.

Thus a need exists for an output stage architecture for a DAC, particularly an oversampled DAC, which provides both high static accuracy and high dynamic accuracy. Such an output stage must be capable of high speed operation with very low intersymbol interference levels.

SUMMARY OF THE INVENTION

This need is met by employing in an output stage for a DAC, such as an oversampled DAC, an apparatus and method which generates, for each bit clock period, two or more (not just one) RTZ signals in response to each input bit. These constituent RTZ signals are essentially identical except for being shifted in time. In the case where two RTZ signals are generated, one is delayed from the other by one-half clock cycle. The two RTZ signals are summed to yield the DAC output from said bit. The sum of the areas under the constituent RTZ signals for a given bit is a constant. As a major effect of clock jitter is to change the areas of the individual, constituent RTZ signals, the effect of clock jitter on the output signal (i.e., the sum of those constituent signals) is alleviated. Suitable modifications are readily apparent for the use of three or more RTZ signals per bit clock period.

This approach prevents the generation of full-scale steps for each bit clock period and essentially eliminates ISI while not increasing sensitivity to clock jitter.

DETAILED DESCRIPTION OF THE DRAWING

The invention will be more fully understood and appreciated from the detailed description below of an illustrative embodiment, which should be read in conjunction with the appended drawing in which.

DETAILED DESCRIPTION

Figure 1:
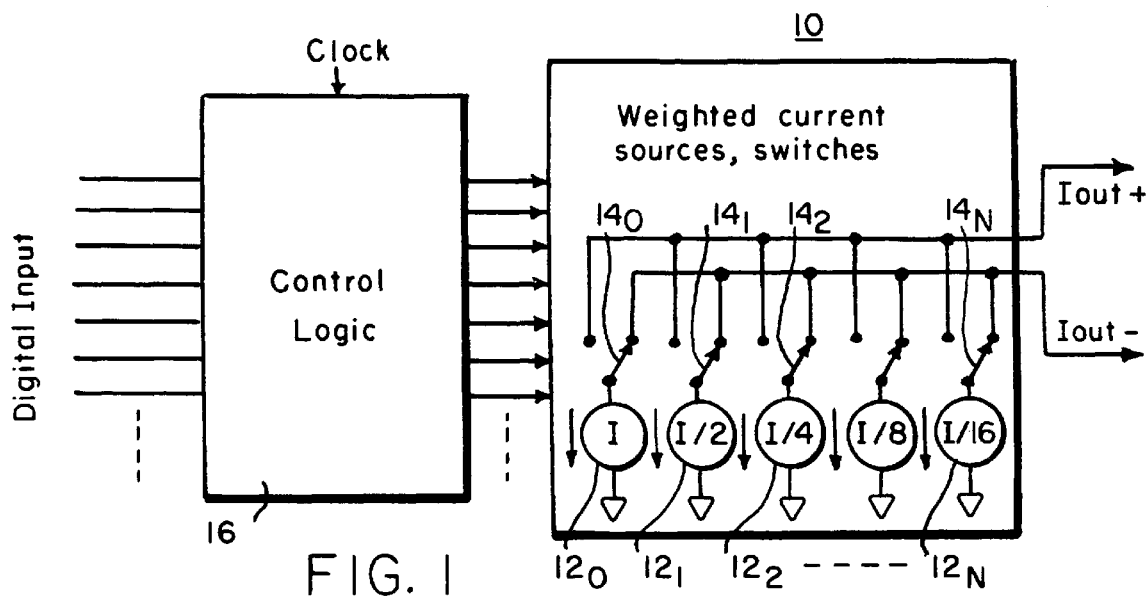
FIG. 1 is a block diagram of a conventional, prior art DAC output stage of the type which gives rise to the need for the invention.
Figure 2:
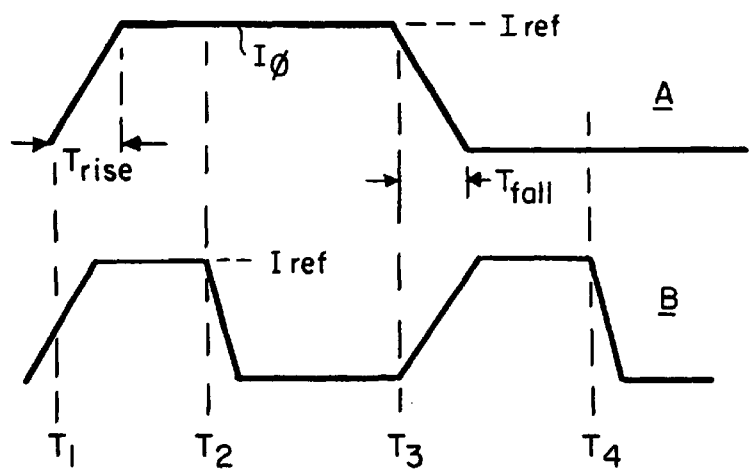
FIG. 2 is an illustration of the contributions of the MSB to the DAC output signal for two different bit sequences, wherein the rise time and the fall time of the MSB signal are unequal.
Figure 3:
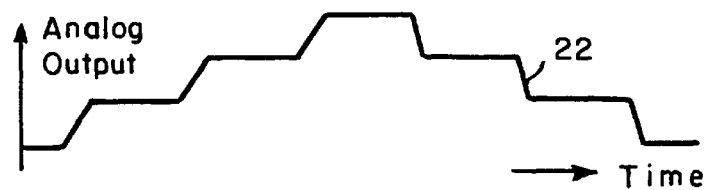
FIG. 3 is an illustration of a conventional DAC output waveform with mismatched rise and fall times.
Figure 4:
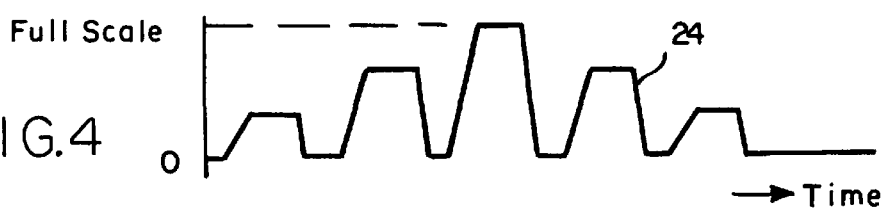
FIG. 4 is an illustration of a corresponding DAC output waveform when the DAC uses an RTZ signaling scheme.
Figure 5:
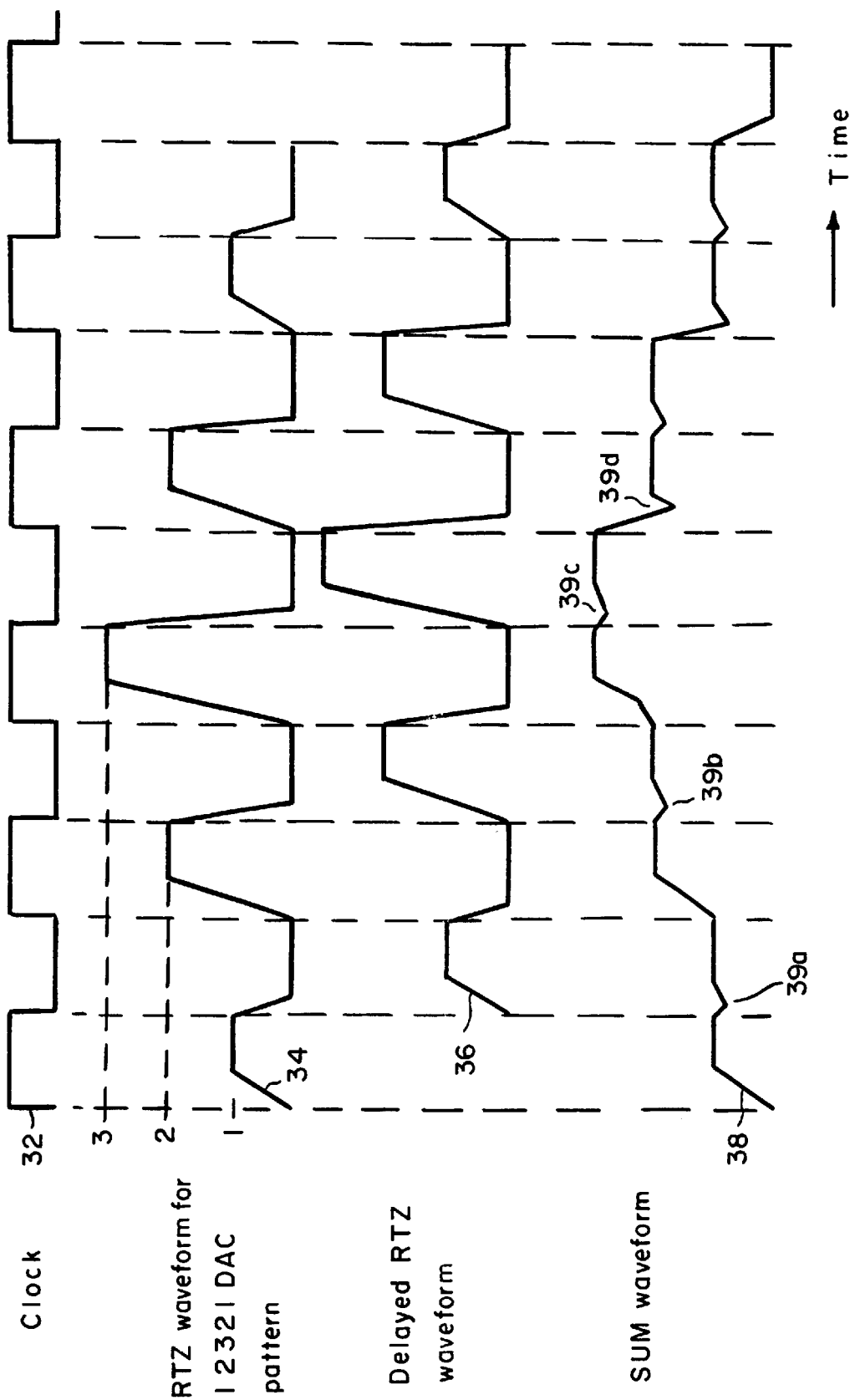
FIG. 5 is an illustration of a set of exemplary multiple RTZ waveforms according to the present invention.

Turning now to FIG. 5, there is shown a set of waveforms which will illustrate the method of the present invention. The waveforms 32–38 are all drawn on the same time scale. Waveform 32 represents the clock signal. A dashed vertical line aligned with each edge of clock signal 32 marks the time at which that clock edge occurs. A bit clock period is one cycle of the clock signal. Waveform 34 depicts an RTZ waveform which returns the output signal to zero on the falling edge of the clock signal. The specific example illustrated in waveform 34 is of a sequence of bits having analog output values 12321. Waveform 36 is identical to waveform 34 except that it is delayed by one-half bit clock period (i.e., one-half clock cycle). When waveforms 32 and 34 are summed, the result is waveform 36. The little notches in waveform 36, such as at 39a–39d, are the result of the rise and fall times being unequal.

Figure 6:
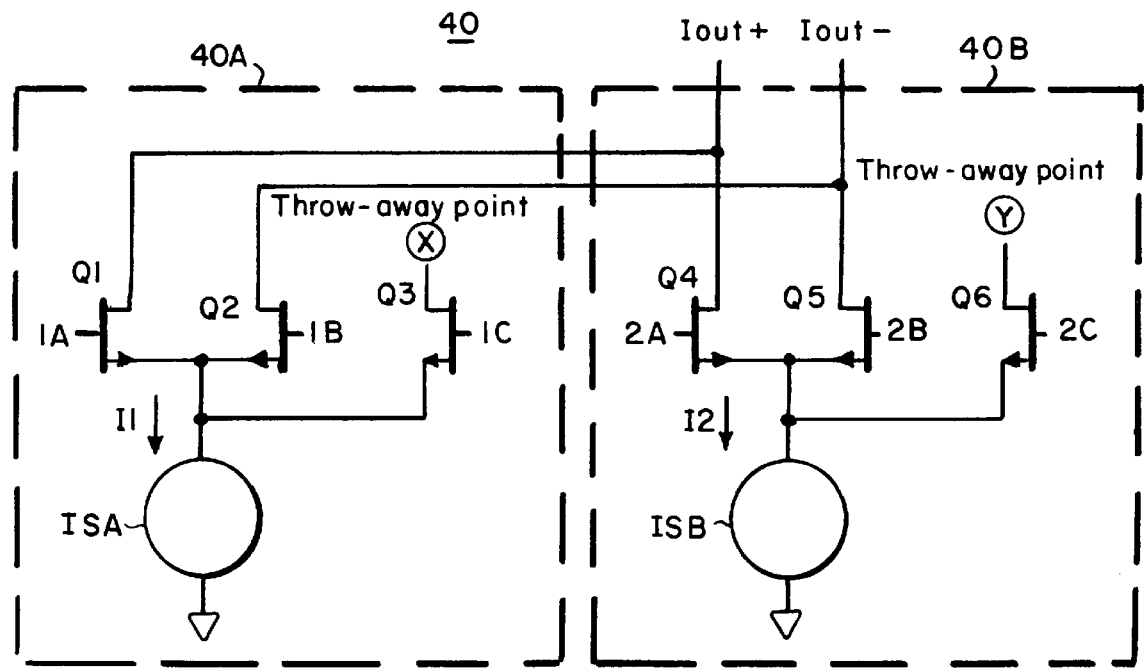
FIG. 6 is a schematic diagram of an exemplary embodiment of a circuit for converting one bit of a digital input code to a constituent analog output signal, according to the invention.
Figure 7:
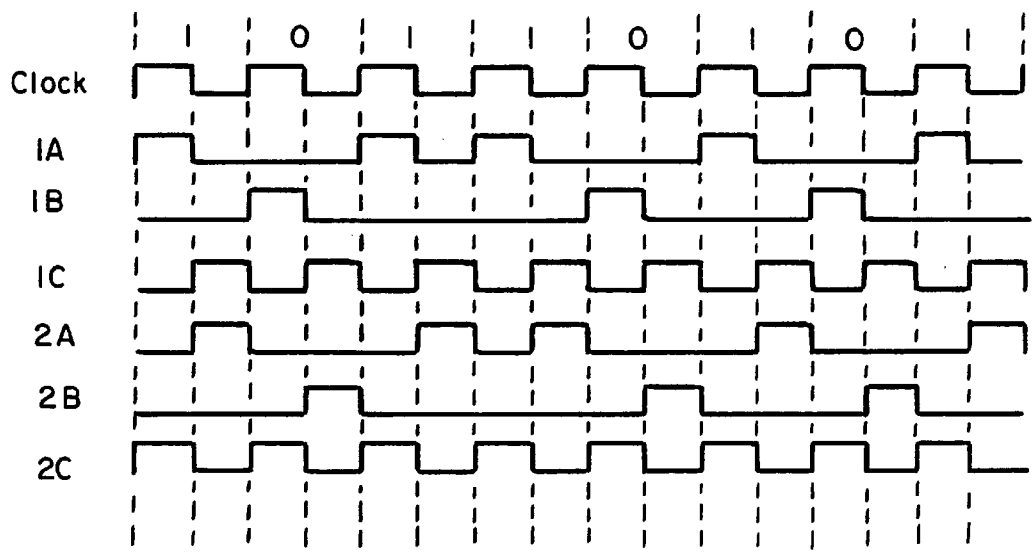
FIG. 7 is a timing diagram showing the waveforms at various locations in the circuit of FIG. 6.
Figure 8:
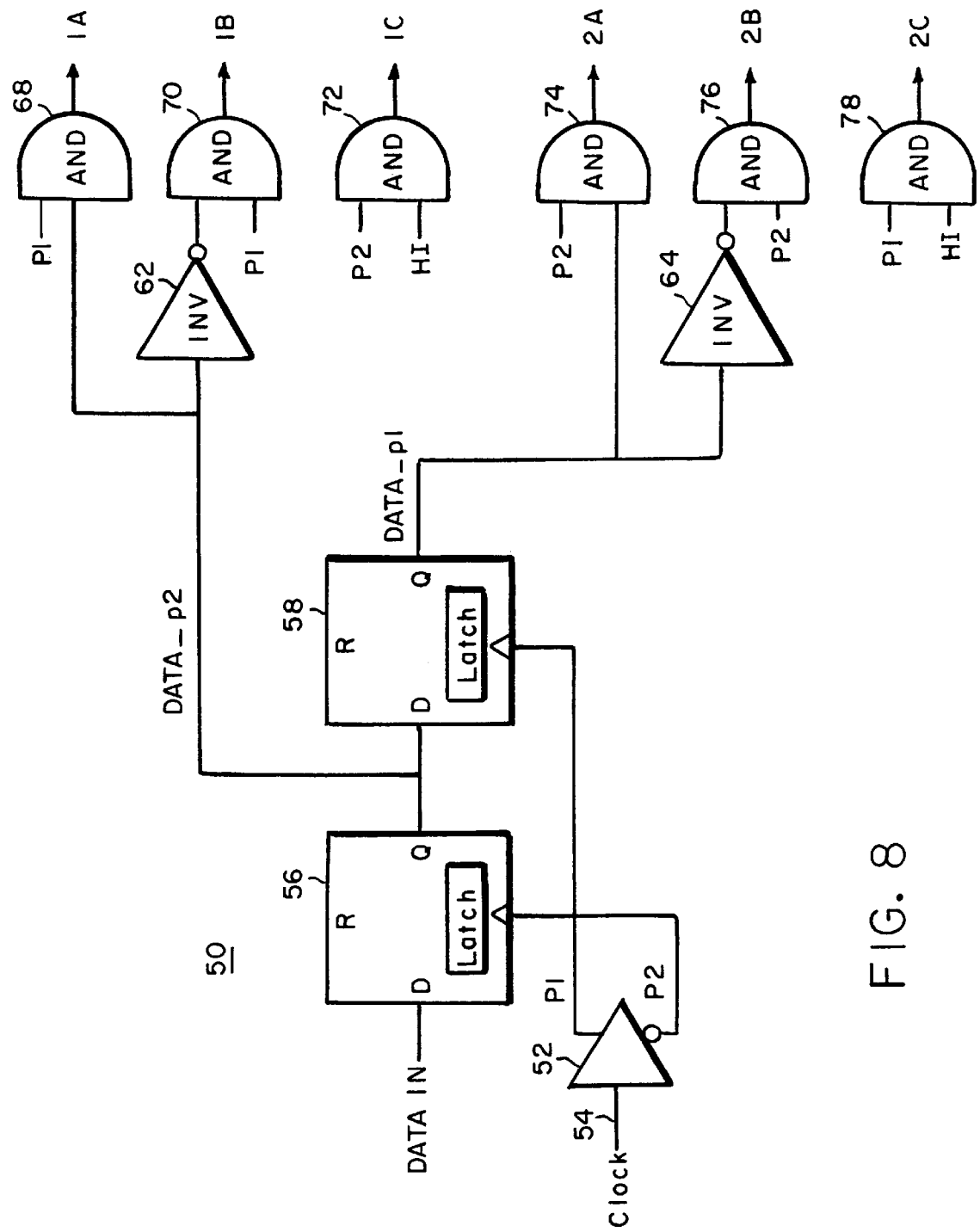
FIG. 8 is a schematic circuit diagram for an exemplary circuit for generating the control signals required by the circuit of FIG. 6, which also are shown in FIG. 7.

FIGS. 6–8 show exemplary circuitry (and its operation) for implementing the dual-RTZ method of FIG. 5. The DAC may use any type of coding; for example, in sigma-delta DACs it is common to use so-called "thermometer codes," where each bit is weighted equally, rather than the more common binary code. As illustrated in the exemplary embodiment, the digital input bits are used to generate RTZ current pulses which are then summed to form the output; however, those skilled in the art will appreciate that voltage pulses can be substituted for current pulses and appropriately summed.

FIG. 6 shows exemplary circuitry for a single bit cell, it being understood that similar circuitry is provided for each bit cell and the current outputs of the cells are then summed. With reference to FIG. 6, a bit cell 40 has two identical (or substantially identical) circuits 40A and 40B. Each of circuits 40A and 40B has three transistors (Q1, Q2 and Q3 for circuit 40A and Q4, Q5 and Q6 for circuit 40B) and a current source. The two circuits 40A and 40B will be referred to as the "phase-1 RTZ circuit" and the "phase-2 RTZ circuit", respectively, as they operate on different phases of the clock signal. Each of circuits 40A and 40B serves as a return-to-zero current signal generator. Transistors Q1 and Q2 steer tail current I1 from current source ISA to either output node Iout+ or output node Iout−, depending on the input data. During the time interval when the output current is meant to be shut off (i.e., the "zero" portion of the RTZ pulse), transistor Q3 is turned on and current I1 is shunted away from nodes Iout+ and Iout− to some "throw-away" point, designated node "X". Thus the current source is always active and problems are avoided which could arise if it were switched off and on.

FIG. 7 provides a timing diagram for the various waveforms at the gates of transistors Q1–Q6 for an exemplary data patter of 10110101. On the rising clock edge, either signal 1A or signal 1B goes high, turning on transistor Q1 or Q2. This delivers the first half of the RTZ waveform to the differential outputs Iout+ and Iout−.

On the falling edge of the clock signal, signal 1C is asserted, shutting off circuit 40A. At the same time, either signal 2A or signal 2B goes high, depending on the data. Note that the data does not change on this clock edge; hence current I2 is steered to the same output as was current I1 in the immediately preceding half-cycle. The clock signals are ideally symmetrical, such that during the clock transition time, the decaying current from the phase-1 RTZ cell 40A matches the rising current from the phase-2 RTZ cell.

On the next rising edge of the clock signal, the phase-2 RTZ cell 40B is switched off by control signal 2C, which likewise shunts current I2 away from the output nodes, or terminals, to some throw-away point (labeled "Y" for generality, though it may be the same point as X). This completes the dual-RTZ pulse delivery, with each current source having contributed to the output for half the clock period.

A suitable control circuit 50, for generating control signals 1A, 1B, 1C, 2A, 2B, and 2C is shown in FIG. 8. A buffer 52 with complementary outputs receives the clock signal on input 54 and provides corresponding true (P1) and complement (P2) clock signals that cross at the fifty-percent voltage point. The P2 signal is used to latch the input data into a latch 56 and to provide a data signal, Data_p2, aligned to P2. The P1 signal is used to re-latch the output of latch 56 and to provide a data signal, Data_p1, aligned to P1. Thus there are provided two data signals which are the same except that Data_p2 is delayed by one-half a clock cycle relative to Data_p1, as required by the dual RTZ technique.

Inverter 62 generates a complement of the Data_p2 signal and inverter 64 generates a complement of the Data_p1 signal. The true and complement versions of the Data_p1 signal are then applied to AND gates 74, 76, respectively, while the true and complement versions of the Data_p2 signal are applied to AND gates 68, 70, respectively. AND gates 68 and 70 also receive the P1 signal as a gate and thus generate the 1A and 1B control signals, respectively. AND gates 74 and 76 also receive the P2 signal as a gate and thus generate the 2A and 2B control signals, respectively. The output control signals from AND gates 68–78 are the control signals which drive the differential current switches Q1, Q2 and Q4, Q5. The control signals to the switches are symmetrical, as the P1 and P2 signals are symmetrical. This reduces the potential for glitches at the DAC outputs during clock transitions.

In order to match the propagation delays experienced by the data signals, the P2 signal is passed through an AND gate 72 to provide the 1C control signal which is used to shut off the current from switch 40A. Likewise, the P1 signal is passed through an AND gate 78 to provide the 2C control signal which is used to shut off the current from switch 40B.

The above-described method of adding multiple pulses of less than a full bit clock period duration solves the intersymbol interference problem without increasing sensitivity to jitter. Why this is so may be understood from two perspectives, one based on linear system theory and one based on time-domain area calculations (i.e., integrals).

Considering first the linear system theory approach, if each of the individual constituent RTZ signals is free of ISI, then their linear sum must also be free of ISI. To reach this conclusion, consider that the area under a single RTZ pulse is completely independent of surrounding pulses. It starts from a zero (or other constant) bases and returns to that base. The area under the sum of two RTZ pulses must be twice the area of a single pulse, even if one of the pulses is delayed. Therefore, the area under the sum of two RTZ pulses is also independent of the bits that come before and after the current bit value.

In the time domain, the area under each output pulse must be constant and independent of the previous and succeeding pulses if ISI is to be eliminated. ISI is typically caused by mismatched rise and fall times in the pulses. If the rise and fall times are mismatched, though, the summed output will using this method will contain small spikes at the clock edge times. This voltage spike contributes to the area under the waveform so as to correct for the area error caused by any interference from the previous pulse.

As previously stated, the problem of clock jitter sensitivity is alleviated by avoiding the full-scale step of a single RTZ pulse. However, this is true only if the same clock edge produces both the falling edge of the phase-1 pulse and the rising edge of the phase-2 pulse. That way, if the indicated clock edge is early or late, one pulse will be widened and the other narrowed but the sum of their areas will be unchanged. If two different clock edges were used, the areas of the constituent pulses could change independently and their sum would not remain constant over a bit clock cycle; this could result in full-scale steps and other loss of benefits of the illustrated embodiment. To retain such benefits in an embodiment using three or more differently-phased RTZ pulse signals, the falling edge of each of the signals should be triggered by the same clock edge as triggers the rising edge of another of the signals. Preferably the rising edge/falling edge pairings cross their fifty-percent points at the same time.

Those skilled in the art will appreciate that the foregoing embodiment was presented by way of example only and that the invention is not limited to this implementation. Numerous modifications and other implementations are possible. For example, rather than using two RTZ current pulses, one could use two RTZ voltage pulses that are then summed in a resistor network. The dual RTZ (or, more broadly, multiple RTZ) signals may be summed actively or passively, using operational amplifiers, resistors, or capacitors. Further, instead of returning to zero, the individual bit signals may be returned to a different, constant value. And as noted above, more than two RTZ pulses can be employed per bit clock period, provided the sum of their areas is independent of all digital input codes preceding and following the code giving rise to those pulses. Further, these techniques and apparatus may be employed to convert any number of digital code bits to an analog output. In particular, in addition to being usable in a multi-bit converter, the invention is usable in a single-bit converter such as a sigma-delta converter. Accordingly, the invention is limited only as required by the following claims and equivalents thereto.

What is claimed is:

1. A digital to analog converter for providing an analog output signal in correspondence with input digital codes, comprising:
   a. at least one source, each source producing an output signal corresponding to the value of a predetermined bit of a digital input code;
   b. when a plurality of sources are present, means for summing the outputs of said sources; and
   c. each source having at least two RTZ signal-generating circuits which produce outputs which, when combined, each contribute to the analog output signal at a different time.

2. The digital to analog converter of claim 1 wherein the at least two RTZ signal-generating circuits produce first and second output pulses whose durations are controlled by a common clock signal.

3. In a digital to analog converter output stage having, for each bit of a digital input code to be converted to an analog output, a switched current source for supplying a component of the analog output during a corresponding bit clock period interval associated with said bit, and means for combining said components to produce the output, the improvement comprising, for each bit of said digital input code:
   1. means for generating, in response to said bit, a first RTZ component output signal,
   2. means for generating, in response to said bit, a second RTZ component output signal, and
   3. means for combining the component output signals to provide the analog output,
   said first and second RTZ component output signals each contributing to the analog output during only a portion of said bit clock period interval and each being independent of the analog output during preceding and subsequent bit clock period intervals.

4. A method of generating an output from a digital to analog converter, comprising the steps of:

a. in response to a digital input bit, generating first and second RTZ signals at different times; and b. combining the first and second RTZ signals.

5. The method of claim 4 wherein the first and second RTZ signals are the same except for being spaced in time by one-half a cycle of a clock associated with a digital input signal.

6. The method of claim 4 or claim 5 wherein the step of combining includes summing the first and second RTZ signals.

* * * * *